(12) United States Patent
Hsieh

(10) Patent No.: US 6,436,764 B1
(45) Date of Patent: Aug. 20, 2002

(54) METHOD FOR MANUFACTURING A FLASH MEMORY WITH SPLIT GATE CELLS

(75) Inventor: Tsong-Minn Hsieh, Miao-Li (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/590,721

(22) Filed: Jun. 8, 2000

(51) Int. Cl.[7] .......................................... H01L 21/8242
(52) U.S. Cl. ....................... 438/257; 438/201; 438/211; 438/257; 438/585; 438/593; 257/314; 257/315
(58) Field of Search ..................... 438/257–67, 585–96, 438/201–211; 257/314–317

(56) References Cited

U.S. PATENT DOCUMENTS

| | | | | |
|---|---|---|---|---|
| 5,304,505 A | * | 4/1994 | Hazani | 437/52 |
| 6,017,795 A | * | 1/2000 | Hsieh et al. | 438/262 |
| 6,054,350 A | * | 4/2000 | Hsieh et al. | 438/261 |
| 6,093,945 A | * | 7/2000 | Yang | 257/317 |
| 6,133,098 A | * | 10/2000 | Ogura et al. | 438/267 |
| 6,232,180 B1 | * | 5/2001 | Chen | 438/257 |
| 6,242,309 B1 | * | 6/2001 | Lee | 438/266 |
| 6,242,774 B1 | * | 6/2001 | Sung | 257/315 |

OTHER PUBLICATIONS

Y. Ma. "A Novel high density contactless flash memory array . . . for 5v–only application" IEEE Symposium on VLSI Technology digest of technical papers. 1994 0–7803–19212–4/94 P. 49–50.*

* cited by examiner

Primary Examiner—Matthew Smith
Assistant Examiner—Granvill D Lee, Jr.
(74) Attorney, Agent, or Firm—Powell Goldstein Frazer & Murphy LLP

(57) ABSTRACT

A method for forming self-aligned split gates in a flesh memory is disclosed. The method includes two-step lithographic definition of a split gate and nitride spacer formation of the gate. The two-step lithography procedure is designed to assist the nitride spacer formation. The nitride spacer formation is used to facilitate gate etching in a self-aligned manner so that the channel length of the split gate is under proper control and the effect of gate misalignment can be totally avoided. The product quality of the flesh memory therefore gets improved.

29 Claims, 5 Drawing Sheets

METHOD FOR MANUFACTURING A FLASH MEMORY WITH SPLIT GATE CELLS

BACKGROUND OF THE INVENTION

1. Field of the Invention

The present invention relates to fabrication of flash memories with split gate structures, and more particularly to fabrication of flash memories utilizing nitride spacers to achieve self-alignment of the split gates.

2. Description of the Prior Art

Portable telecommunications and computing market has become a major driving force in semiconductor IC (Integrated Circuits) design and technology. The growing market requires low power, high density, and electrically re-writable non-volatile memories, either embedded or stand-alone. Flash memory is one popular choice other than EEPROM (Electrically Erasable and Programmable ROM) because of its small size and improved reliability.

Many of the existing flash memories utilize split gate structures in the memory cells. A split gate cell generally merges a select gate with a storage gate over channel region to prevent the cell from going into depletion mode as a result of overerasing. One typical flash memory with split gate cells is constructed with triple level of polysilicon (rather than two levels used in the earliest flash), as depicted in FIG. 1. The first polysicon layer 10 formed over substrate 5 is used as both the select gate and the lower control gate. The second polysilicon 20 is a floating gate and the third poly layer 30 is the upper control gate. The floating gate is sandwiched between two layers of control gate. The capacitance between floating gate and control gate is effectively increased since the capacitance of the floating gate with the upper and lower controls gates is additive. The capacitance, however, between the floating gate and the substrate is decreased by the shielding effect of the lower control gate and select gate, therefore a low capacitance ratio is achieved resulting in a high drive current.

In order to save the cell size of flash memory, the split gate structures are often designed in symmetric shape (mirror symmetry) for junction sharing (such as junction 40 in FIG. 1) among the adjacent gate cells. A schematic representation of part of the cell fabrication process is shown in FIGS. 2A to 2B. As shown in FIG. 2A, after the first conductive layer 10 having gate oxide 12 is defined and oxide layer 14 is formed to isolate the second conductive layer 20, photo resist 24 is utilized (with optional use of a supporting isolation layer 22) to define the second conductive layer 20. Once the construction of the second conductive layer 20 is completed, cell junctions 40 are formed, as illustrated in FIG. 2B, by ion implantation.

One can noted that in the prior techniques for manufacturing the conventional flash structure, the floating gate is not self-aligned to the select gate (and the lower control gate). As a result, misalignment of the split gates often occurs during the fabrication process, and thus affects channel length of the gate cells and results in possible failing of even and odd bit lines of the circuit. For example, when an X value of lithographic misalignment takes place for the gate structures, one of the two symmetric pair cells would gain X value of channel length and another would lose X value of the length. That results in 2X value of channel length difference of the paired gates. The asymmetric channel lengths bring current variations of the adjacent gate cells. The wild current distribution could cause program mismatch and sub-threshold disturbance, which is disadvantageous for multi-level flash application.

It would be desirable to have a method for forming split gate cells using self-alignment techniques to improve product quality of the flash memories.

SUMMARY OF THE INVENTION

In accordance with the present invention, a method is provided for forming split gate cells in a flash memory that substantially solves the aforementioned problems. Nitride spacer formation is used to facilitate gate etching in a self-aligning manner so that the channel length of the split gate is under proper control and the effect of misalignment can then be totally avoided.

In one embodiment, first conductive structures are first defined on a semiconductor substrate with an oxide layer forming thereon for appropriate gate isolation. Deposition of second conductive layer is then proceeded. Next, a photo resist is patterned to partially define the second conductive structures (leaving the portions that are intended to be etched by self-aligning method un-defined). After the patterned photo resist is removed, a thin oxide layer is grown on the surface of the partially defined second conductive structure as a buffer protection. Masking by the partially defined second conductive structure and the first conductive structures, implantation is performed to form several junctions within the substrate. A layer of nitride is thereafter deposited and dry etched to formed nitride spacers over side walls of the first and second conductive structures (Note: since the conductive structure surface is protected by oxide, the nitride spacers are formed in fact on the oxide surface). After the formation of the nitride spacers, conventional lithographic techniques are then applied to finish defining the second conductive structures. A thick oxide layer deposited on the second conductive structures is optionally used to facilitate the lithography process.

Due to the incorporation of the nitride spacers, the final definition of the second conductive structures can now be accomplished in a self-aligning manner. Ion implantation is then followed to complete the junction formation. The application of the self-aligning etching makes the junction formation falling in a much reliable position and thus enhances control of the channel length. The product quality of the flesh memory is therefore improved.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
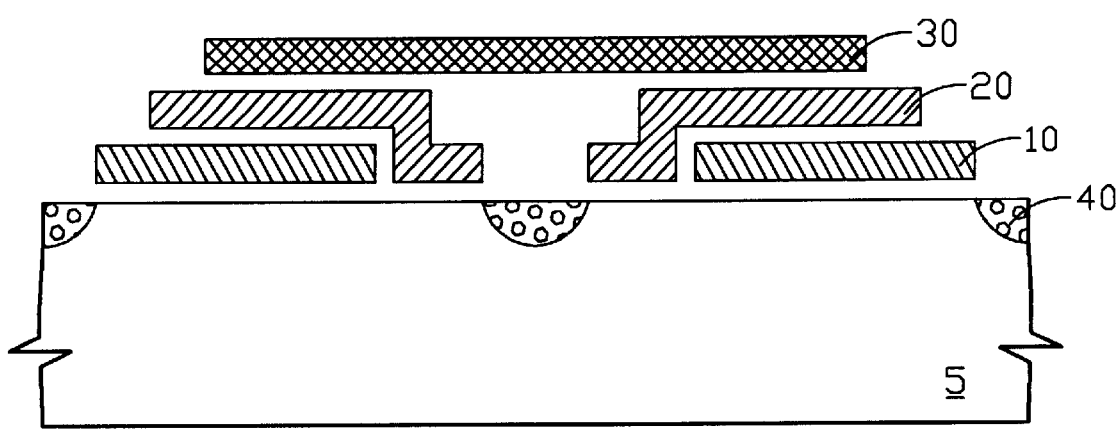
FIG. 1 shows schematic cross-section of a flesh memory cell using triple level polysilicon.
Figure 2A:
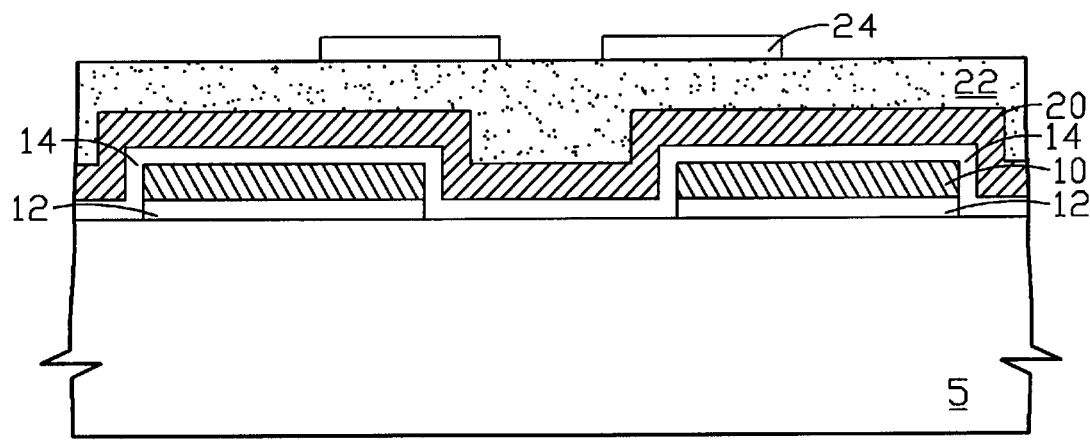
FIGS. 2A to 2B illustrates conventional process flow in manufacture of the lower two levels (out of the triple level) of polysilicon flesh memory cell.
Figure 2B:
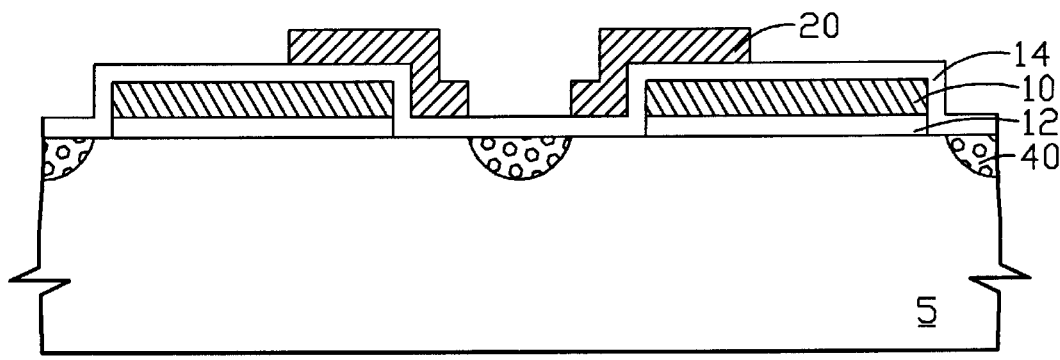

The invention disclosed herein is directed to a method for forming self-aligned split gates in a flesh memory. In the following description, numerous details are set forth in order to provide a thorough understanding of the present invention. It will be appreciated by one skilled in the art that variation of these specific details are possible while still achieving the results of the present invention. In other instances, well-known processing steps are not described in detail in order not to unnecessarily obscure the present invention. The drawing figures that are included with this specification and which represent cross-sections of portions of an integrated circuit during fabrication are not drawn to scale, but instead are drawn so as to illustrate the relevant features of the invention.

Figure 3A:
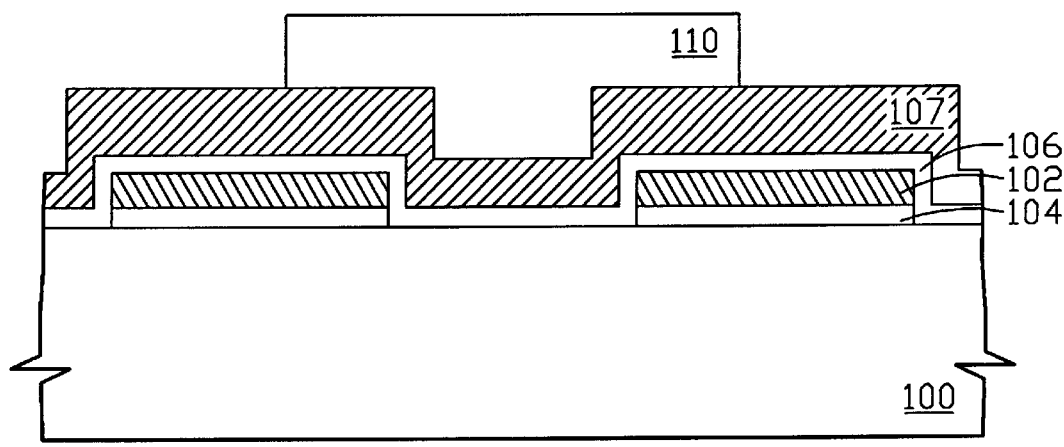
FIGS. 3A to 3F shows cross-sectional views of a process flow in which self-aligning techniques are used for fabricating a flesh memory in accordance with one embodiment of the present invention.

Referring now to FIGS. 3A to 3F, a preferred embodiment of the present invention is described. As shown in FIG. 3A, processing begins by providing a semiconductor substrate 100 on which two first conductive gates 102 each having a gate oxide layer 104 are defined. The first conductive gates 102 are generally comprised of polysilicon material. They are typically provided for the use of select gates of the memory cell. A thin layer of dielectric layer 106, preferably oxide, is deposited over the substrate 100 to provide surface insulation of the first conductive gates and form tunnel oxide above channel regions of the cells. Once the insulation 106 is formed, a conductive layer 107 for forming second conductive gates, generally floating gates, of the memory cell is then deposited over the dielectric layer 106. The conductive layer 107 is preferably polysilicon layer. In the conventional method, the conductive layer 107 is now patterned and etched to form gate structures in generally one masking step. Rather, in the preferred embodiment, the construction of the second conductive gates 109 is done by two different masking procedures to facilitate a particular spacer formation step in-between. For the first masking step, photoresist 110 patterning is now proceeded, as indicated in the figure, to define the outer portions of the second conductive gates. The partially defined second conductive layer 108 forms a continuous structure overlying a portion of each of the two adjacent first conductive gates 102.

Figure 3B:
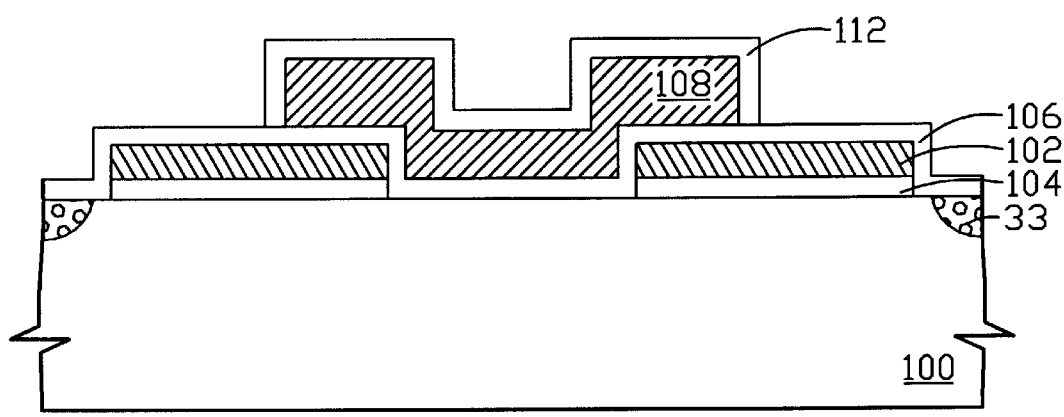

After the photoresist 110 is removed, referring to FIG. 3B, a layer of dielectric 112, preferably oxide, is grown over the partially defined second conductive structure 108 as buffer protection. Either thermal oxidation or chemical vapor deposition technique can be applied for the buffer layer 112 formation. Masking by the first conductive gates 102 and the partially defined second conductive structure 108, first junction regions 33 is subsequently formed within the substrate 100 by doping technique such as ion implantation.

Figure 3C:
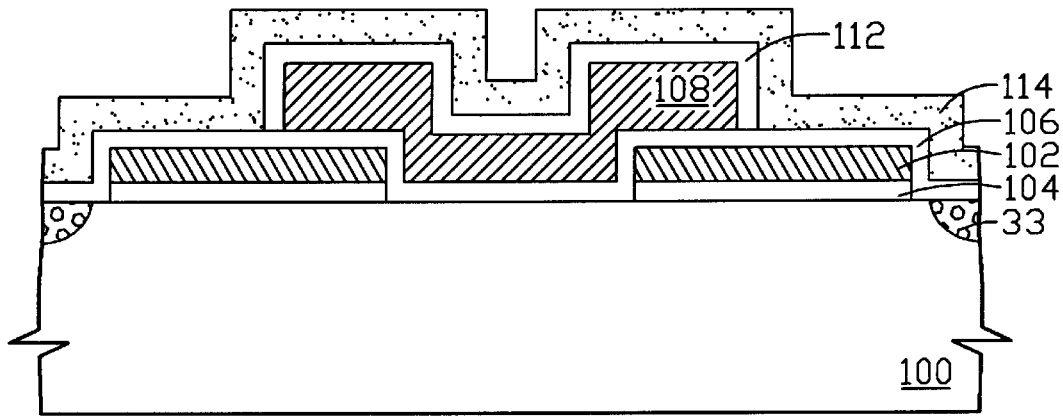
Figure 3D:
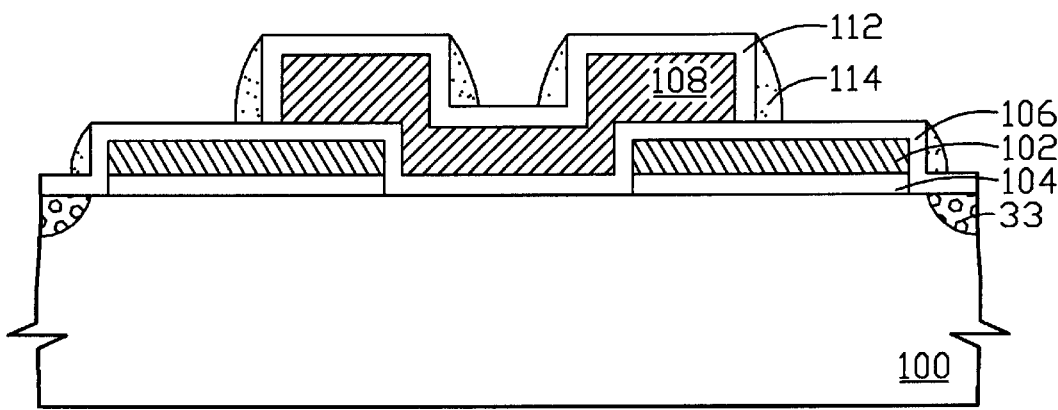
Figure 3E:
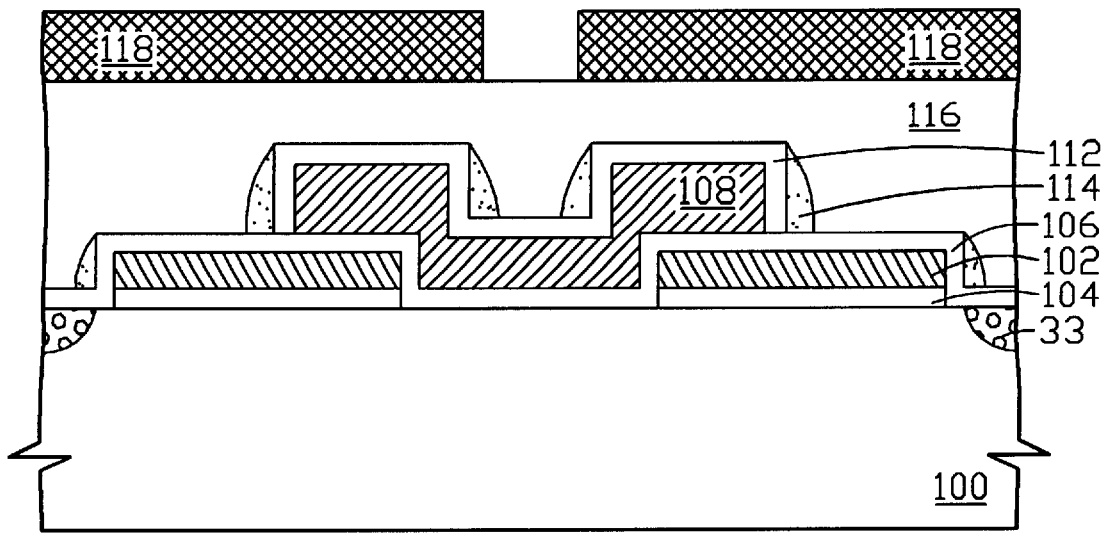

Next, a thick layer of dielectric 114, composed of highly etching selective material of oxide, is deposited over the dielectric buffer layer 112 to a depth in the range from 2000 to 3000 angstroms, as shown in FIG. 3C. Nitride is one preferable selection for the dielectric 114. Dry etching procedure is then applied on the dielectric layer 114 to form dielectric spacers 114 over the side walls of all the conductive structures, as illustrated in FIG. 3D.

Figure 3F:
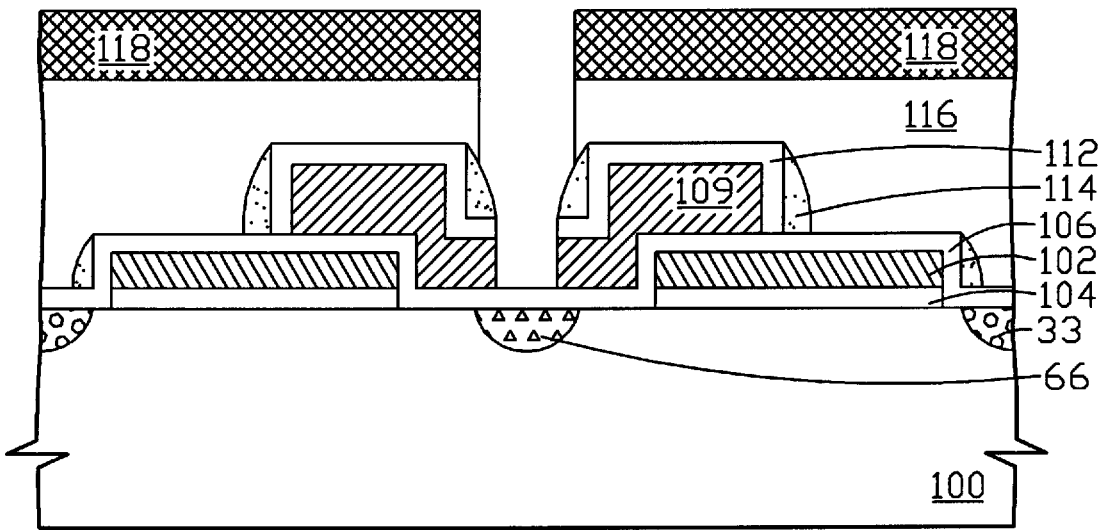

Once the spacers 114 are formed, one could proceed the second masking procedure for complete definition of the second conductive gates. To accomplish that, referring then to FIG. 3E, a thick dielectric supporting layer 116 made of oxide can be first formed over the substrate 100 surface to facilitate the subsequent lithographic procedure. Patterned photoresist 118 is then formed on the oxide layer 116. Etching of the oxide 116, oxide 106 and the second conductive layer 108 is consecutively done to divide the second conductive layer 108 into two symmetric gate structures 109 and complete the gate definition, as illustrated in FIG. 3F. Due to the existence of the spacers 114, the etching procedure herein is thus accomplished in a self-aligning manner. The possibilities of gate misalignment are therefore totally avoided in this etching procedure. Finally, the device is further treated with ion implantation to form a second junction region 66 between the two first junction regions 33 within the substrate 100 for the paired symmetric gate cells to share. The implantation of the second junction 66 can now be governed by manipulating the thickness of the second conductive gates 109 and the formation of the dielectric spacers 114. The channel length is thus under better control than the prior art.

Although specific embodiments have been illustrated and described, it will be obvious to those skilled in the art that various modifications may be made without departing from what is intended to be limited solely by the appended claims. For example, the proposed method can be utilized for various conductive levels (such as the third poly self-aligning to the second poly) in any flesh memory cell with mirror imaged symmetry.

What is claimed is:

1. A method for forming a flash memory device on a semiconductor substrate, comprising:

defining at least two first conductive structures over said substrate;

depositing a first insulating layer over said substrate to insulate said at least two first conductive structures, said first insulating layer comprises first insulating material;

depositing a first conductive layer over said first insulating layer;

patterning and etching said first conductive layer to form a second conductive structure overlying a portion of each of two adjacent said first conductive structures;

forming a second insulating layer on said second conductive structure, wherein said second insulating layer comprises said first insulating material;

forming two first junction regions within said substrate using said two adjacent first conductive structures and said second conductive structure as masking;

forming dielectric spacers on said second insulating layer over side walls of said second conductive structure, wherein said dielectric spacers comprise second insulating material;

patterning and etching said second conductive structure in a self-aligned manner to form two separate conductive structures; and forming a second junction region between said two first junction regions within said substrate using said two separate conductive structures and said two adjacent first conductive structures as masking.

2. The method according to claim 1, wherein said at least two first conductive structures comprise select gates.

3. The method according to claim 2, wherein each of said select gates comprises a gate oxide layer and a first conductive layer.

4. The method according to claim 1, wherein said at least two first conductive structures comprise floating gates.

5. The method according to claim 1, wherein said at least two first conductive structures comprise doped polysilicon.

6. The method according to claim 1, wherein said first insulating material comprises oxide.

7. The method according to claim 1, wherein said second insulating material comprises nitride.

8. The method according to claim 1, wherein said second insulating layer is formed by chemical vapor deposition.

9. The method according to claim 1, wherein said second insulating layer is formed by thermal oxidation.

10. The method according to claim 1 further comprising forming a third insulating layer over said second conductive structure and said dielectric spacers to facilitate the patterning of said separate conductive structures.

11. The method according to claim 10, wherein said third insulating layer comprises first insulating material.

12. The method according to claim 10, wherein said third insulating layer comprises oxide.

13. The method according to claim 1, wherein said separate conductive structures comprises floating gate.

14. The method according to claim 1, wherein said separate conductive structures comprise doped polysilicon.

15. The method according to claim 1, wherein the etching process for forming said separate conductive structures comprises selective etching of said first insulating material and said second insulating material.

16. The method according to claim 1, wherein said two first junction regions are formed by ion implantation.

17. The method according to claim 1, wherein said second junction region is formed by ion implantation.

18. A method for forming a flash memory device, comprising:

defining two select gates over a substrate, wherein each of said select gates comprises a gate oxide layer and a first conductive layer;

depositing an inter dielectric layer over said substrate to insulate said select gates;

depositing a second conductive layer over said inter dielectric layer;

patterning and etching said second conductive layer to form a conductive structure overlying a portion of each of said two select gates;

forming a dielectric buffer layer on said conductive structure, wherein said dielectric buffer layer comprises the same insulating material as said inter dielectric layer;

forming two first junction regions within said substrate using said two select gates and said conductive structure as masking;

depositing a dielectric spacer layer over said dielectric buffer layer, wherein said dielectric spacer layer comprises different insulating material as said dielectric buffer layer;

dry etching said dielectric spacer layer to form dielectric spacers over side walls of said conductive structure;

depositing a dielectric supporting layer over said substrate, wherein said dielectric supporting layer comprises different insulating material as said dielectric spacers;

patterning and etching said dielectric supporting layer, said dielectric buffer layer and said conductive structure in a self-aligned manner to form two floating gates; and forming a second junction region between said two first junction regions within said substrate using said two float gates and said two select gates as masking.

19. The method according to claim 18, further comprising forming at least a control gate over said floating gates.

20. The method according to claim 18, wherein said first conductive layer comprises doped polysilicon.

21. The method according to claim 18, wherein said second conductive layer comprises doped polysilicon.

22. The method according to claim 18, wherein said inter dielectric layer comprises oxide.

23. The method according to claim 18, wherein said dielectric spacer layer comprises nitride.

24. The method according to claim 18, wherein said dielectric spacer layer is deposited to a thickness ranging from 2000 to 3000 angstroms.

25. The method according to claim 18, wherein said dielectric supporting layer comprises oxide.

26. The method according to claim 18, wherein said dielectric buffer layer is formed by chemical vapor deposition.

27. The method according to claim 18, wherein said dielectric buffer layer is formed by thermal oxidation.

28. The method according to claim 18, wherein said two first junction regions are formed by ion implantation.

29. The method according to claim 18, wherein said second junction region is formed by ion implantation.

* * * * *